(12) United States Patent
Liu et al.

(10) Patent No.: US 11,637,223 B2
(45) Date of Patent: Apr. 25, 2023

(54) LIGHT EMITTING DIODE DEVICE

(71) Applicant: XIAMEN SANAN OPTOELECTRONICS TECHNOLOGY CO., LTD., Xiamen (CN)

(72) Inventors: Xiaoliang Liu, Xiamen (CN); Anhe He, Xiamen (CN); Kang-wei Peng, Xiamen (CN); Su-hui Lin, Xiamen (CN); Ling-yuan Hong, Xiamen (CN); Chia-hung Chang, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 206 days.

(21) Appl. No.: 17/064,250

(22) Filed: Oct. 6, 2020

(65) Prior Publication Data

US 2021/0066549 A1   Mar. 4, 2021
US 2022/0123176 A2   Apr. 21, 2022

Related U.S. Application Data

(63) Continuation-in-part of application No. PCT/CN2018/082195, filed on Apr. 8, 2018.

(30) Foreign Application Priority Data

Apr. 1, 2020 (CN) .......................... 202010252278.3

(51) Int. Cl.
*H01L 33/38* (2010.01)
*H01L 33/40* (2010.01)
*H01L 33/46* (2010.01)

(52) U.S. Cl.
CPC .......... *H01L 33/405* (2013.01); *H01L 33/382* (2013.01); *H01L 33/46* (2013.01);
(Continued)

(58) Field of Classification Search
CPC ..... H01L 2933/0016; H01L 2933/0025; H01L 33/00; H01L 33/38; H01L 33/382;
(Continued)

(56) References Cited

U.S. PATENT DOCUMENTS

2013/0049053 A1* 2/2013 Kususe .................. H01L 33/38
  257/E33.072
2018/0138382 A1* 5/2018 Chae ..................... H01L 33/387
(Continued)

FOREIGN PATENT DOCUMENTS

CN   103515504 A   1/2014
CN   107681032 A   2/2018

OTHER PUBLICATIONS

Search Report issued to PCT application No. PCT/CN2018/082195 by the WIPO dated Nov. 1, 2018.
(Continued)

*Primary Examiner* — Julia Slutsker
*Assistant Examiner* — Dmitriy Yemelyanov
(74) *Attorney, Agent, or Firm* — Thomas | Horstemeyer, LLP

(57) ABSTRACT

An LED device includes an epitaxial layered structure, a current spreading layer, a first insulating layer and a reflective structure. The current spreading layer is formed on a surface of the epitaxial layered structure. The first insulating layer is formed over the current spreading layer, and is formed with at least one first through hole to expose the current spreading layer. The reflective structure is formed on the first insulating layer, extends into the first through hole, and contacts with the current spreading layer. The current
(Continued)

spreading layer is formed with at least one opening structure to expose the surface of the epitaxial layered structure.

30 Claims, 18 Drawing Sheets

(52) U.S. Cl.
CPC ............... *H01L 2933/0016* (2013.01); *H01L 2933/0025* (2013.01)

(58) Field of Classification Search
CPC ....... H01L 33/405; H01L 33/42; H01L 33/44; H01L 33/46
See application file for complete search history.

(56) References Cited

U.S. PATENT DOCUMENTS

| | | | |
|---|---|---|---|
| 2019/0067525 A1* | 2/2019 | Xu | H01L 33/0093 |
| 2020/0020830 A1* | 1/2020 | Liu | H01L 33/44 |

OTHER PUBLICATIONS

Search Report appended to an Office Action, which was issued to Chinese counterpart application No. 201880004805.X by the CNIPA dated Jan. 22, 2021 with an English translation thereof.

\* cited by examiner

US 11,637,223 B2

LIGHT EMITTING DIODE DEVICE

CROSS-REFERENCE TO RELATED APPLICATION

This application is a continuation-in-part (CIP) of International Application No. PCT/CN2018/082195, filed on Apr. 8, 2018. This application also claims priority of Chinese Invention Patent Application No. 202010252278.3, filed on Apr. 1, 2020. The entire content of each of the international and Chinese patent applications is incorporated herein by reference.

FIELD

The disclosure relates to a semiconductor electronic device, and more particularly to a light emitting diode device.

BACKGROUND

Illuminating devices, i.e., light emitting diode (LED) devices, are generally used as solid light sources which have advantages of long lifespan, energy conservation, recyclability and safety. LED devices are usually made of a semiconductor material, such as gallium nitride (GaN), gallium arsenide (GaAs), gallium phosphide (GaP) and gallium arsenide phosphide (GaAsP).

A conventional LED device includes a light emitting epitaxial layered structure, and a reflective layer disposed on the light emitting epitaxial layered structure. Such reflective layer might be a distributed Bragg reflector (DBR) having a relatively larger refractive index difference or might be a metal layer (such as Ag layer) having a relatively higher reflectance. However, the DBR exhibits angular dependence and unsatisfactory thermal conductivity, and the reflectance of the metal layer which is generally approximately 95%, is difficult to be increased. Therefore, the external light extraction of the conventional LED device might be adversely affected by these reflective layers, thereby confining the illumination efficiency of the conventional LED device.

In addition, since the LED device having a flip chip structure is free of wire bonding and has high luminous efficacy and good heat dissipation, such flip chip LED device are widely developed for various applications. The flip chip LED device often utilizes a transparent conductive layer (e.g., electrically conductive metal oxide such as ITO) as a P-type ohmic contact layer for an epitaxial layered structure. Nevertheless, the transparent conductive layer still has a predetermined optical loss after being subjected to a melting process at high temperature for achieving a higher transmittance. The predetermined optical loss may inhibit the increase of brightness of the flip chip LED device. Moreover, formation of an ohmic contact in a p-type semiconductor layer of the flip chip LED device is difficult to be achieved without using such transparent conductive layer.

SUMMARY

Therefore, an object of the disclosure is to provide an LED device that can alleviate at least one of the drawbacks of the prior art.

According to the disclosure, the LED device includes an epitaxial layered structure, a current spreading layer, a first insulating layer and a reflective structure. The epitaxial layered structure includes a first-type semiconductor layer, a second-type semiconductor layer, and an active layer disposed between the first-type and second-type semiconductor layer. The current spreading layer is formed on a surface of the second-type semiconductor layer opposite to the active layer. The first insulating layer is formed over the current spreading layer, and is formed with at least one first through hole to expose a portion of the current spreading layer. The reflective structure is formed on the first insulating layer, extends into the at least one first through hole, and contacts with the current spreading layer. The current spreading layer is formed with at least one opening structure to expose a portion of the surface of the second-type semiconductor layer opposite to the active layer. The opening structure is arranged in a staggered arrangement with the first through hole.

BRIEF DESCRIPTION OF THE DRAWINGS

Other features and advantages of the disclosure will become apparent in the following detailed description of the embodiments with reference to the accompanying drawings, of which:

FIGS. 1 to 10 are fragmentary schematic views illustrating consecutive steps of a method for manufacturing a first embodiment of an LED device according to the disclosure, wherein FIG. 4 is a cross sectional view taken along line A-A of FIG. 5;

FIGS. 14 to 23 are fragmentary schematic views illustrating consecutive steps of a method for manufacturing the third embodiment, wherein FIGS. 15, 17, 19 and 21 are cross sectional views taken along line B-B of FIGS. 14, 16, 18 and 20, respectively;

DETAILED DESCRIPTION

Figure 1:
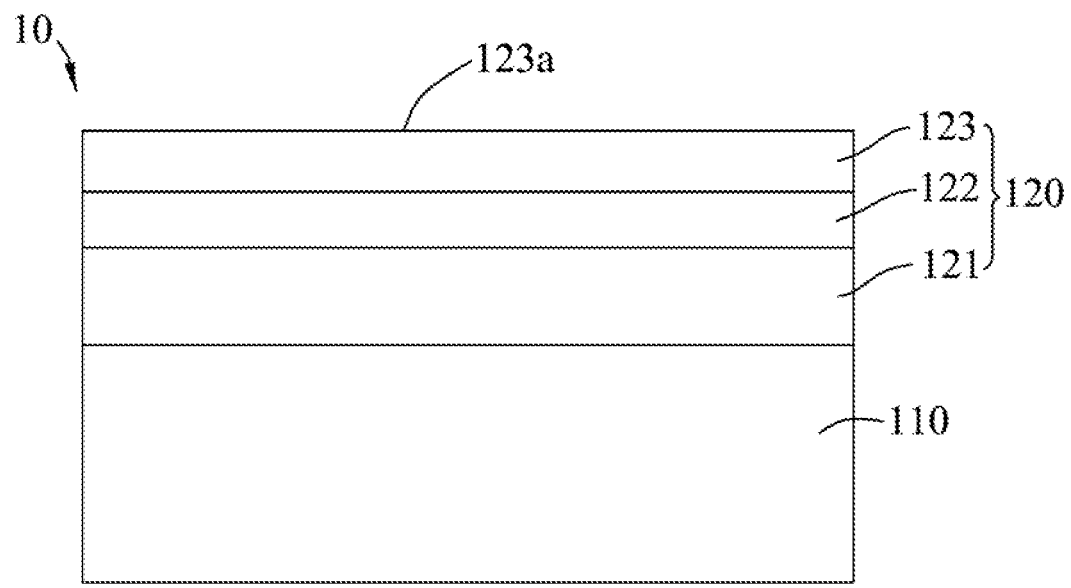

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIGS. 1 to 10, a first embodiment of an LED device 10 according to this disclosure is manufactured by a method including the following consecutive steps.

As shown in FIG. 1, a substrate 110 is provided, and an epitaxial layered structure 120 is formed on the substrate 110 by e.g., a metal organic chemical vapor deposition (MOCVD) process.

The substrate 110 may be made of, for example, planar sapphire, patterned sapphire, silicon carbide, gallium nitride or gallium arsenide. In this embodiment, the substrate 110 is made of patterned sapphire. The substrate 110 may be removed or thinned after the formation of the epitaxial layered structure 120.

The epitaxial layered structure 120 includes a first-type semiconductor layer 121, an active layer 122 and a second-type semiconductor layer 123 sequentially disposed on the substrate 110 in such order. The first-type semiconductor layer 121 may be one of a P-type semiconductor layer and an N-type semiconductor layer, and the second-type semiconductor layer 123 may be the other one of the P-type semiconductor layer and the N-type semiconductor layer. In this embodiment, the epitaxial layered structure 120 is a gallium nitride (GaN)-based structure, i.e., the first-type semiconductor layer 121 is an n-GaN layer, the second-type semiconductor layer 123 is a p-GaN layer, and the active layer 122 is a GaN-based layer having a multiple quantum well structure. The material for making each layer of the epitaxial layered structure 120 can be chosen according to practical requirements, and is not limited herein.

Figure 2:
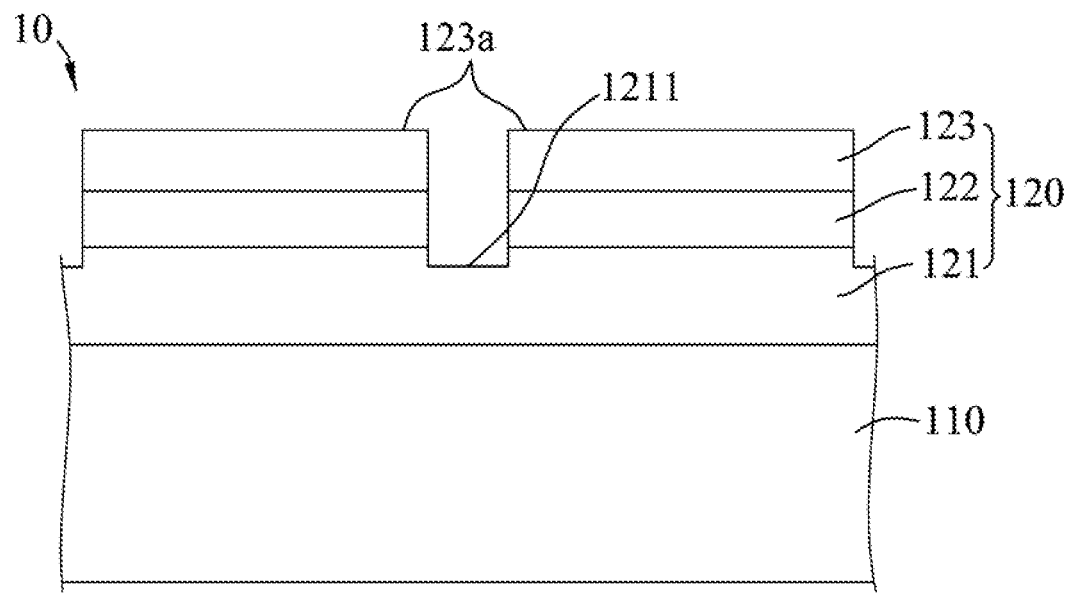

The epitaxial layered structure 120 may further include a buffer layer disposed between the substrate 110 and the first-type semiconductor layer 121, and an electron blocking layer (EBL) disposed between the active layer 122 and the second-type semiconductor layer 123 (not shown in the figures). Referring to FIG. 2, the epitaxial layered structure 120 is subjected to an etching process to form at least one recess 1211 that is defined by a recess-defining wall, that extends through the second-type semiconductor layer 123 and the active layer 122, and that terminates at the first-type semiconductor layer 121 to expose a portion of the first-type semiconductor layer 121. The etching process may be, for example, an inductively coupled plasma (ICP) process or a reactive ion etching (RIE) process. The number of the recess 1211 can be increased according to the structure, usage or size of the LED device 10. It is noted that when the LED device 10 has a vertical structure, there is no need to form the recess 1211 in the epitaxial layered structure 120.

Figure 3:
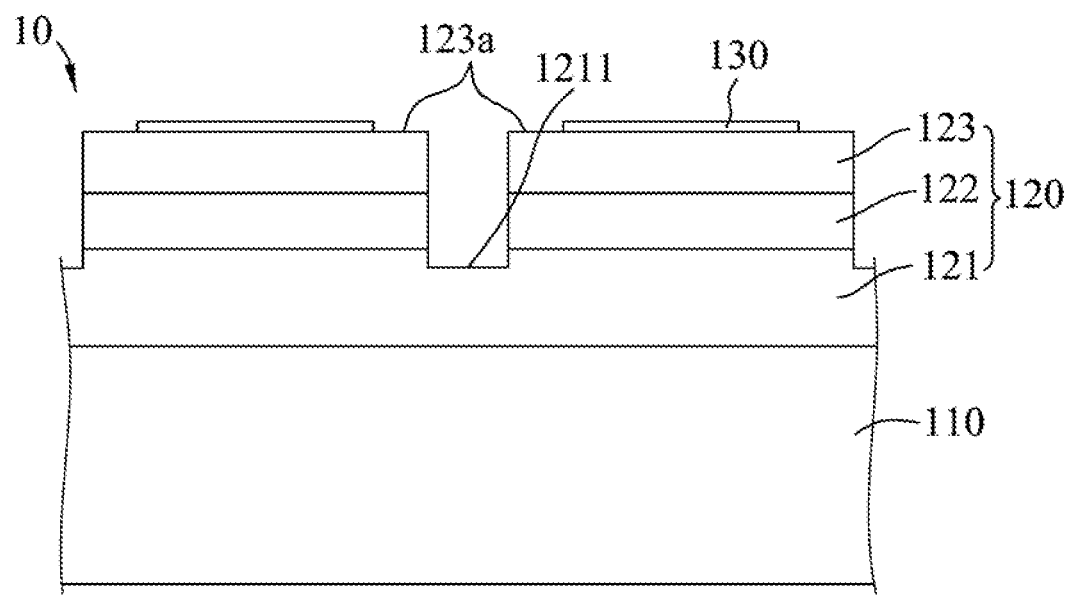
Figure 4:
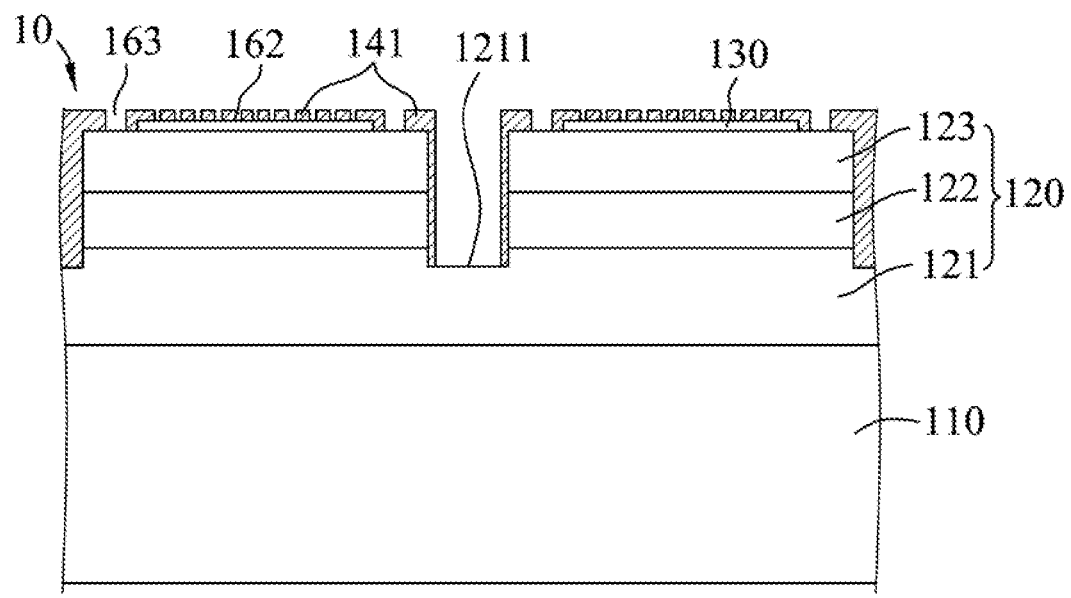

Referring to FIG. 3, a current spreading layer 130 is then formed on a surface 123a of the second-type semiconductor layer 123 opposite to the active layer 122. The current spreading layer 130 may be made of a metal oxide that is transparent to the light emitting from the active layer 122. Examples of the metal oxide for making the current spreading layer 130 may include, but are not limited to, indium tin oxide (ITO), zinc oxide (ZnO), indium zinc tin oxide, indium zinc oxide (IZO), zinc tin oxide (ZTO), indium gallium tin oxide, indium gallium oxide (IGO), gallium zinc oxide (GZO), aluminum (Al)-doped zinc oxide, and fluoride-doped tin oxide. Alternatively, the current spreading layer 130 may be made of graphene. In this embodiment, the current spreading layer 130 is an ITO layer made by an evaporation process or a sputtering process. The current spreading layer 130 is capable of forming an ohmic contact with the second-type semiconductor layer 123 by melting. In certain embodiments, lithography and etching processes may further be performed on the current spreading layer 130 to make the current spreading layer 130 on the surface 123a "shrink" so that a first insulating layer 141 to be formed subsequently can cover the sidewall of the current spreading layer 130, as shown in FIG. 4. Further, the current spreading layer 130 may be formed with at least one opening structure to expose a portion of the surface 123a of the second-type semiconductor layer 123 opposite to the active layer 122.

Referring to FIG. 4, the first insulating layer 141 is formed over the current spreading layer 130, and is formed with at least one first through hole 162 by etching to expose a portion of the current spreading layer 130. The first insulating layer 141 may further cover the recess-defining wall and expose the first-type semiconductor layer 121. In this embodiment, the first insulating layer 141 is formed with a plurality of the first through holes 162 arranged in an array (see FIG. 5). The opening structure of the current spreading layer 130 is arranged in a staggered arrangement with the first through holes 162.

The first insulating layer 141 may be formed by a chemical vapor deposition (CVD) process, and may be made of a material having a low refractive index, such as silicon oxide ($SiO_2$), magnesium fluoride ($MgF_2$), and an aluminum oxide ($Al_2O_3$), and/or a material having a high refractive index, such as titanium dioxide ($TiO_2$). In certain forms, the first insulating layer 141 includes a distributed Bragg reflector (DBR) made of materials having low and high refractive indices. In other forms, the first insulating layer 141 is made of $SiO_2$. With the difference of refractive indices between the first insulating layer 141 and the current spreading layer 130, an angle of the total reflection may be changed so that the light extraction can be enhanced. The first insulating layer 141 has a transmittance and a thickness greater than those of the current spreading layer 130. In certain forms, the first insulating layer 141 has a thickness greater than 50 nm.

Figure 5:
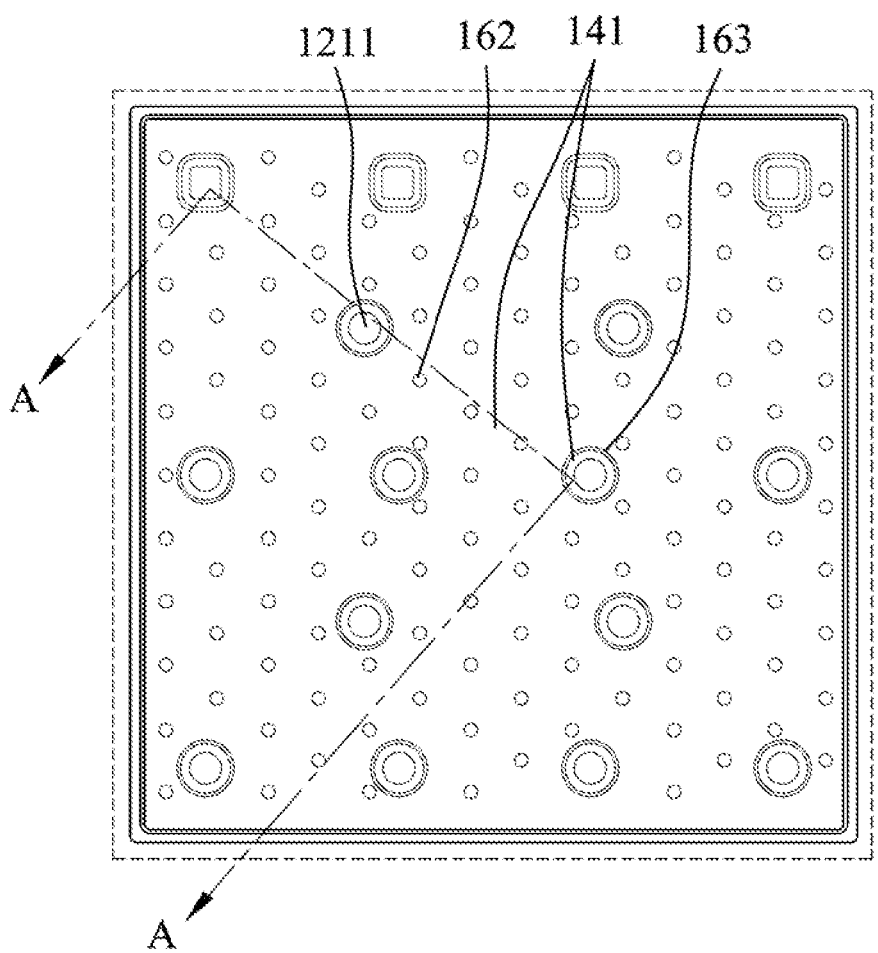

The first through holes 162 may be formed by an etching process. The first insulating layer 141 is further formed on the surface 123a of the second-type semiconductor layer 123, and is further formed with at least one second through hole 163 to expose a portion of the surface 123a of the second-type semiconductor layer 123. The second through hole 163 corresponds in position and space to the opening structure of the current spreading layer 130. The second through hole 163 also corresponds in position to and surrounds the recess 1211. As such, the second through hole 163 has a diameter larger than that of the recess 1211. Each of the second through holes 163 is formed in one of a continuous loop shape (such as a circular loop shape and a rectangular loop shape), a discontinuous loop shape and a strip shape. In this embodiment, the first insulating layer 141 is formed with a plurality of second through holes 163 that are formed in continuous circular and rectangular loop shapes (as shown in FIG. 5).

Each of the first through holes 162 and the second through holes 163 has a diameter ranging from 1 μm to 50 μm. In certain forms, the diameter of each of the first through holes 162 and the second through holes 163 ranges from 1 μm to 20 μm. A ratio of the number of the first through holes 162 to the number of the second through holes 163 ranges from 5:1 to 50:1. In certain forms, the ratio of the number of the first through holes 162 to the number of the second through holes 163 ranges from 10:1 to 30:1. In general, the number of the second through holes 163 is substantially the same as the number of the recess 1211, and each of the second through holes 163 has a shape similar to a respective one of the recesses 1211.

The first through holes 162 of the first insulating layer 141 have a total cross-sectional area accounting for 3% to 50% of an area of a projection of the epitaxial layered structure 120 on the substrate 110. In certain forms, the first through holes 162 have a total cross-sectional area accounting for 5% to 20% (such as 10%) of an area of a projection of the epitaxial layered structure 120. If the total cross-sectional area of the first through holes 162 is too small, the contact area between the current spreading layer 130 and a reflective structure 150 to be formed subsequently thereon may be too small to allow a better control of a forward voltage ($V_F$). On the contrary, if the total cross-sectional area of the first through holes 162 is too large, the reflectance of an omni-directional reflector (ODR) structure cooperatively formed by the current spreading layer 130, the first insulating layer 141 (e.g., one having a low refractive index) and the reflective structure 150 will be adversely effected.

Figure 6:
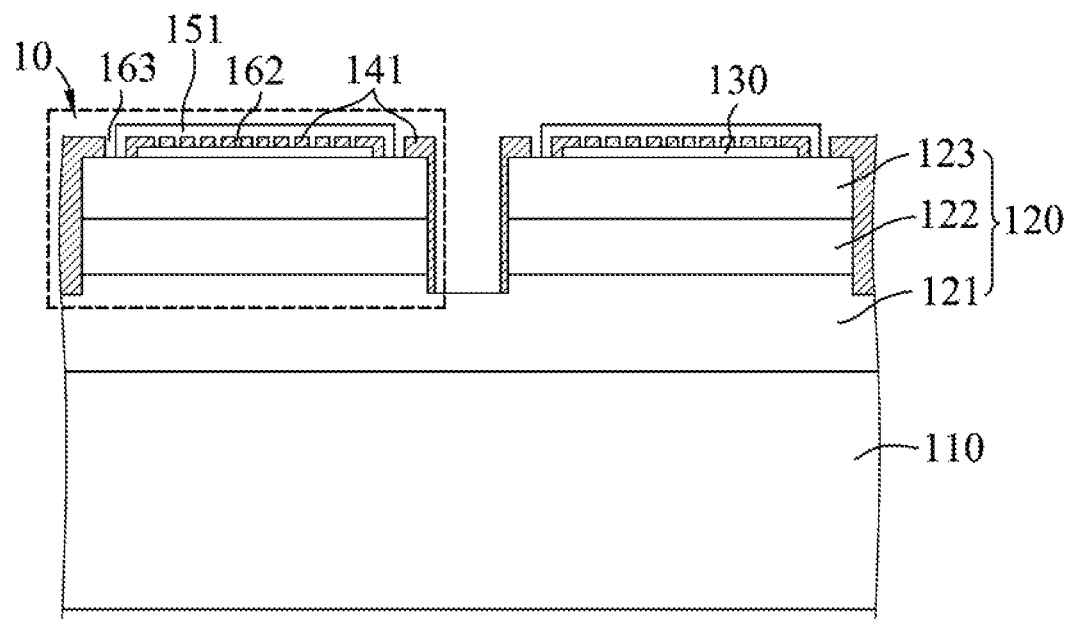
Figure 7:
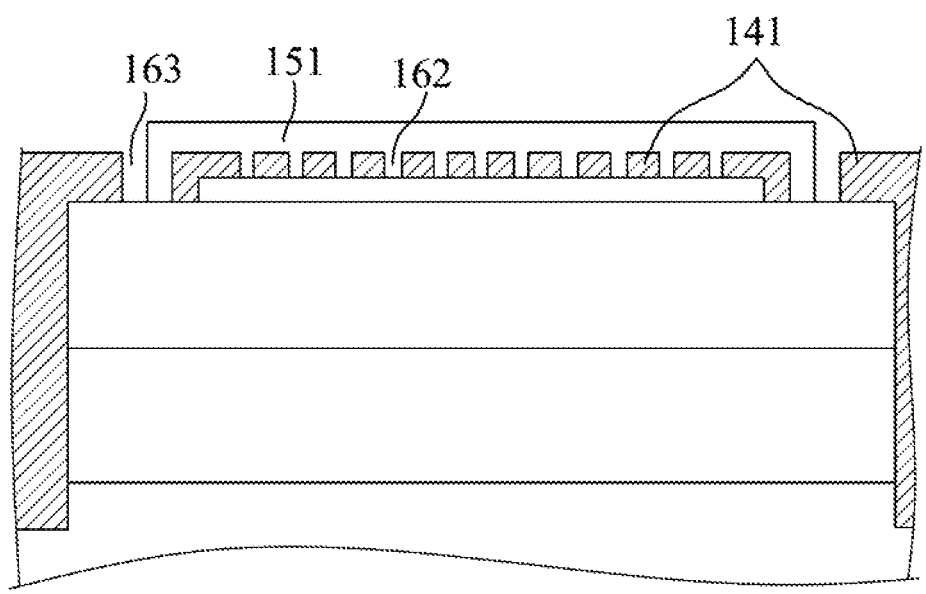
Figure 8:
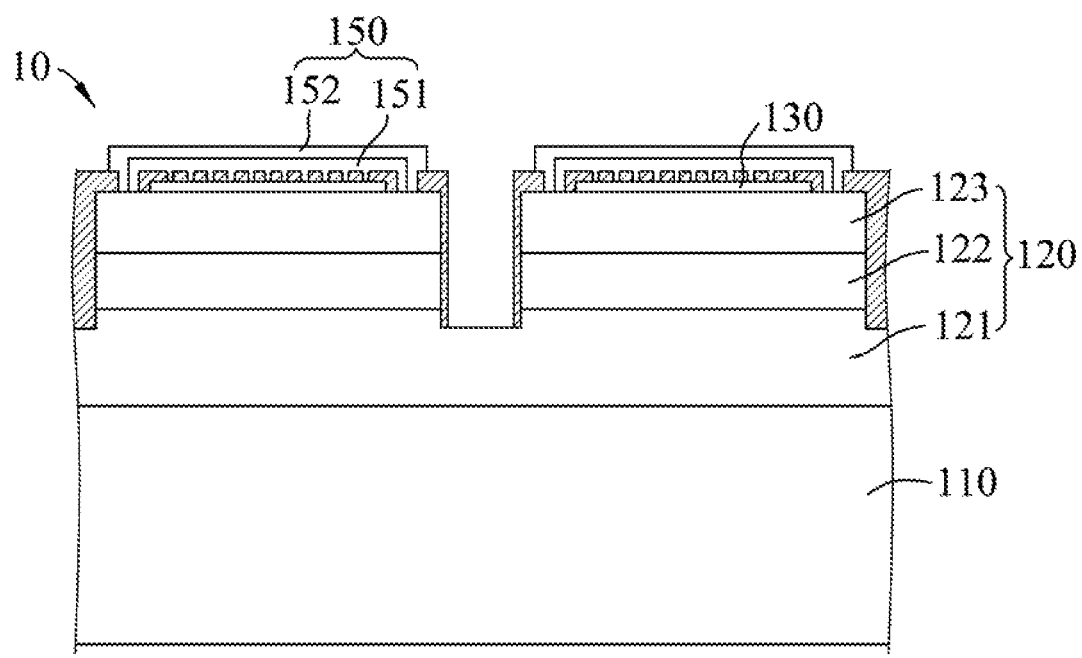

Referring to FIGS. 6 to 8, the reflective structure 150 is formed on the first insulating layer 141, extends into the first through holes 162, and contacts with the current spreading layer 130. The reflective structure 150 may further extend into the second through holes 163 and contacts with the second-type semiconductor layer 123. In this way, the adherence between the reflective structure 150 and the first insulating layer 141 may be enhanced, thereby increasing the reliability of the LED device 10.

The reflective structure 150 may be formed by an evaporation process or an sputtering process. In this embodiment, the reflective structure 150 includes multiple layers, i.e., a metallic reflecting layer 151 and a metallic barrier layer 152 sequentially formed on the first insulating layer 141 in such order, but are not limited thereto. The metallic reflecting layer 151 may be made of a metal having high reflectance, such as aluminum (Al) or silver (Ag) for serving as a mirror, and the metallic barrier layer 152 may be made of titanium tungsten (TiW), chromium (Cr), platinum (Pt) or titanium (Ti) for protecting the metallic reflecting layer 151. In certain forms, the metallic reflecting layer 151 is fully encapsulated by the metallic barrier layer 152.

Figure 9:
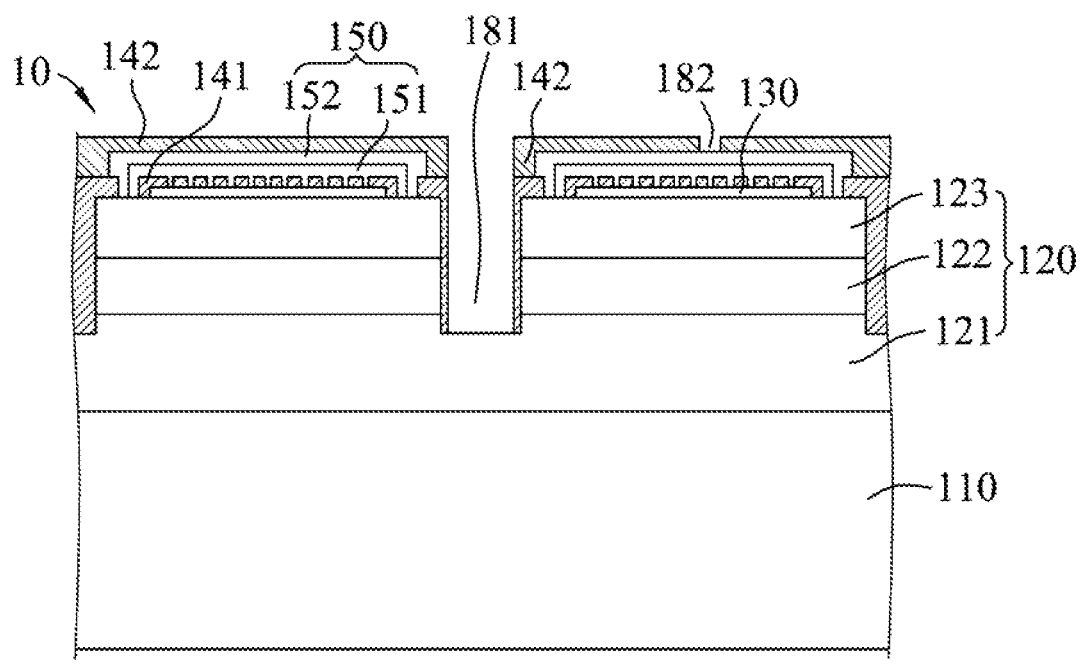
Figure 10:
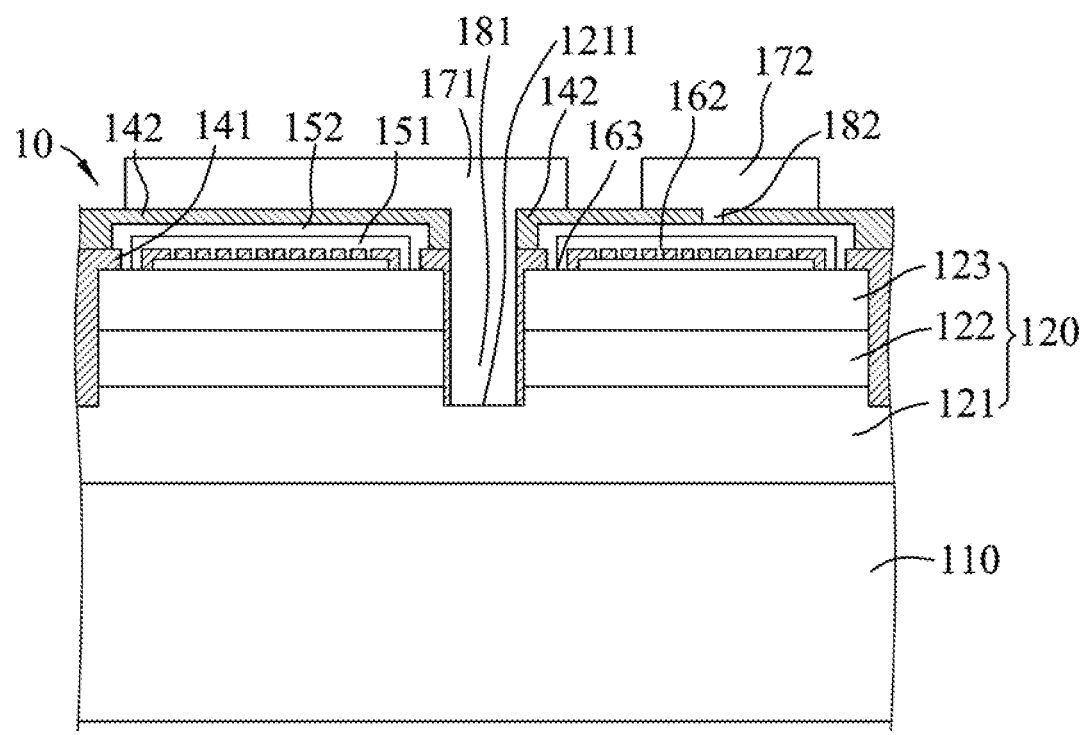

Referring to FIGS. 9 and 10, a first electrode 171 is electrically connected to the first-type semiconductor layer 121 through the recess 1211, and a second electrode 172 is disposed on the reflective structure 150 and is electrically connected to the second-type semiconductor layer 123. The first electrode 171 may be one of an N-type electrode and a P-type electrode, and the second electrode 172 may be the other one of the N-type electrode and the P-type electrode. In this embodiment, the first electrode 171 is an N-type electrode and the second electrode 172 is a P-type electrode.

Before forming the first and second electrodes 171, 172, a second insulating layer 142 may be first disposed over the reflective structure 150. The second insulating layer 142 is formed with a first penetrating hole 181 that is spatially communicated with the recess 1211 to expose the first-type semiconductor layer 121, and is formed with a second penetrating hole 182 to expose the reflective structure 150 (see FIG. 9). The first penetrating hole 181 serves as a window for the first electrode 171, and the second penetrating hole 182 serves as a window for the second electrode 172. In such case, the second electrode 172 is disposed on the second insulating layer 142, and further fills the second penetrating hole 182 to contact with the reflective structure 150. The first electrode 171 is disposed on the second insulating layer 142, and is electrically connected to the first-type semiconductor layer 121 through the recess 1211 and the first penetrating hole 181.

The process and the material for making the second insulating layer 142 may be the same as those of the first insulating layer 141. The first and second penetrating holes 181, 182 may be formed by lithography and etching. The first penetrating hole 181 may correspond in number to the number of the second penetrating hole 182. The second penetrating hole 182 may have an area equal to or larger than that of the first penetrating hole 181. Moreover, the second penetrating hole 182 may be formed in a shape different from that of the first penetrating hole 181. For example, the first penetrating hole 181 may be formed in a loop shape and the second penetrating hole 182 may be formed in a strip shape. When the first and second penetrating hole 181, 182 are different in area and/or shape, the polarity of the first and second electrodes 171, 172 to be disposed therein can be easily differentiated.

The first penetrating hole 181 corresponds in number to the number of the recess 1211. The recess 1211 may have an area larger than that of the first penetrating hole 181, which allows the recess-defining wall to be covered by the first and/or second insulating layer 141, 142.

In certain forms, the first electrode 171 has an area equal to an area of the second electrode 172. The first electrode 171 and the second electrode 172 may be positioned in a symmetrical relationship, such as in axial symmetry or in rotational symmetry. An area of the first electrode 171 over the second insulating layer 142 accounts for 90% of a total area of the first electrode 171. An area of the second electrode 172 over the second insulating layer 142 accounts for 90% of a total area of the second electrode 172. In this way, each of the first and second electrodes 171, 172 may have a substantially planar top surface which can be beneficial for die bonding and packaging of the LED device 10 (e.g., a flip-chip LED device) and thus, improves reliability thereof. In addition, an area of the first electrode 171 above the second insulating layer 142 may be larger than an area of the first electrode 171 above the recess 1211, so that decrease in the light emitting area caused by the recess 1211 can be reduced while maintaining the planarity of the first electrode 171 and eliminating the difference between the height of the first electrode 171 to the second insulating layer 142 and the height of the first electrode to the exposed first-type semiconductor layer 121.

Finally, the resulting LED device 10 shown in FIG. 10 may be further cut to form separated LED chips.

It is noted that a third insulating layer (not shown) may be further formed on the first and second electrodes 171, 172, and then the third insulating layer may be etched to form penetrating holes serving as windows for disposition of third and fourth electrodes.

Figure 11:
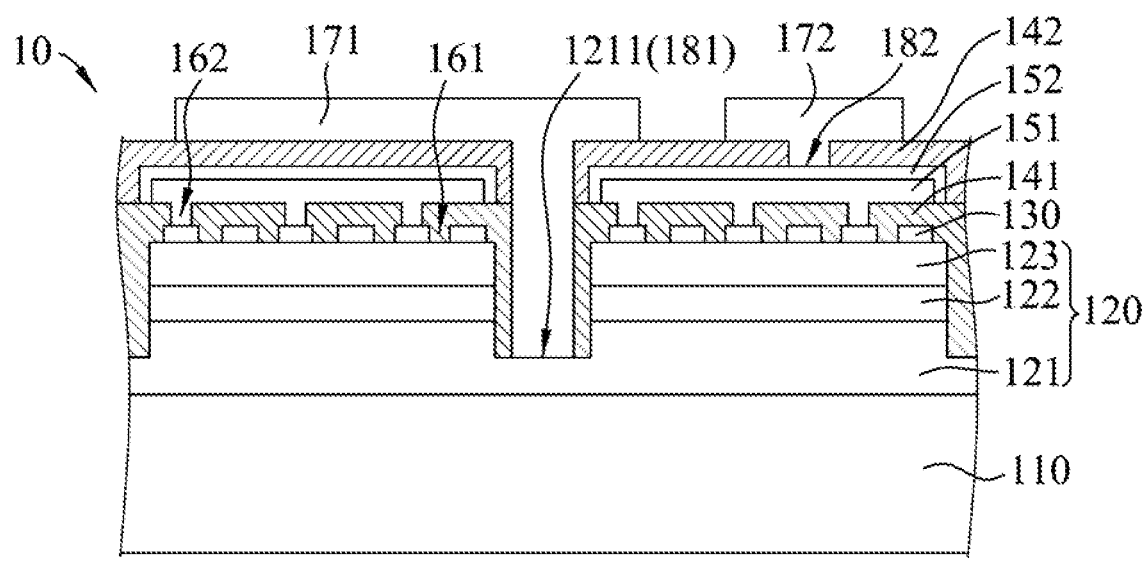
FIG. 11 is a fragmentary schematic view illustrating a second embodiment of the LED device according to the disclosure.
Figure 12:
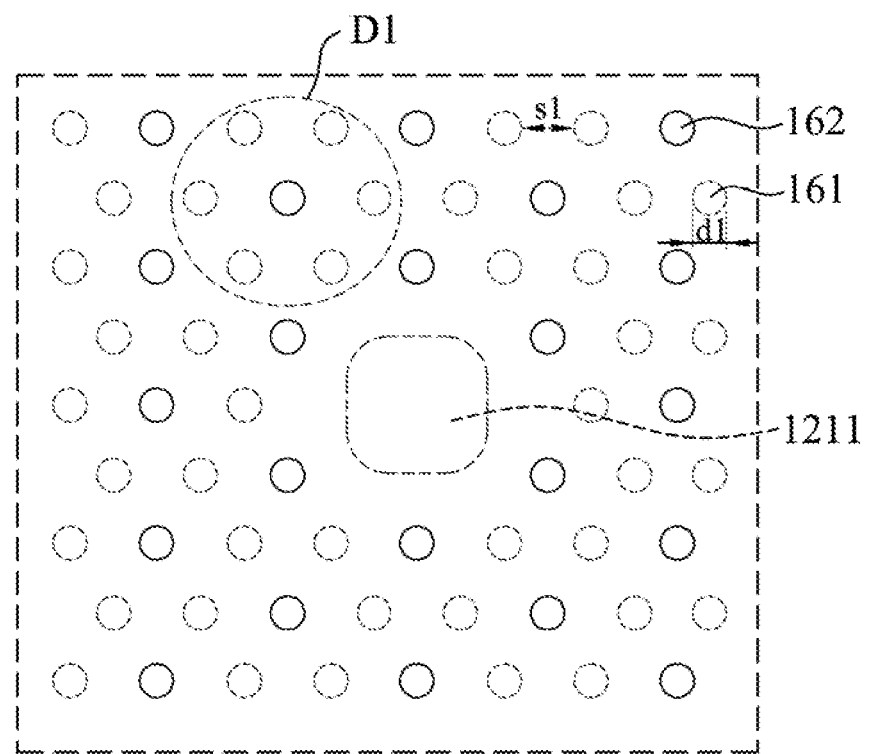
FIG. 12 is a top view illustrating the second embodiment.

Referring to FIGS. 11 and 12, a second embodiment of the LED device 10 is generally similar to the first embodiment, except that in the second embodiment, the second through holes 163 of the first insulating layer 141 are omitted, and the opening structure of the current spreading layer 130 includes at least one first opening 161 to expose a portion of the surface 123a of the second-type semiconductor layer 123. Specifically, the current spreading layer 130 is formed with a plurality of the first openings 161 that are arranged in a staggered arrangement with the recess 1211. The first insulating layer 141 extends into the first openings 161 and contacts with the second-type semiconductor layer 123. In this embodiment, the LED device 10 has a relative smaller size, e.g., with a length smaller than 300 μm.

The current spreading layer 130 may be made of a conductive metal oxide (such as ITO) which exhibits good current spreading performance and is capable of forming desired ohmic contact with the second-type semiconductor layer 123. The active layer 122 may be configured to emit light having an emission wavelength not greater than 520 nm. However, the conductive metal oxide may have optical absorption at a wavelength not greater than 520 nm, and the optical absorption becomes serious as the wavelength increases. Taking ITO as an example, the optical absorption reaches to a range of 3% to 15% at a wavelength ranging from around 400 nm to 460 nm, and may be even larger at a wavelength of ultraviolet light (below 400 nm). Thus, by controlling the size and density of the first openings 161 on the current spreading layer 130, the optical absorption of the current spreading layer 130 may be greatly reduced. In certain forms, the first openings 161 have a total cross-sectional area accounting for 5% to 50% of an area of a projection of the epitaxial layered structure 120 on the substrate 110. That is, the current spreading layer 130 may have a total area accounting for more than 50% and less than 95% (such as 70% to 90%) of an area of a projection of the epitaxial layered structure 120 on the substrate 110. In such way, sufficient ohmic contact between the current spreading layer 130 and the second-type semiconductor layer 123 can be achieved while the area of the current spreading layer 130 can be reduced, thereby increasing the brightness of the LED device 10.

The first openings 161 may be arranged in an array. Each of the first openings 161 has a diameter (d1) ranging from 2 μm to 50 μm. The first openings 161 are spaced apart from one another by a spacing (s1) ranging 1 μm to 20 μm. In this embodiment, the diameter (d1) of each of the first openings 161 ranges from 2 μm to 10 μm and the spacing (s1) thereof ranges from 5 μm to 20 μm.

The current spreading layer 130 may have a thickness ranging from 5 nm to 60 nm. When the thickness of the current spreading layer 130 is smaller than 5 nm, the forward voltage ($V_F$) of the LED device may increase. When the thickness of the current spreading layer 130 is greater than 60 nm, the optical absorption caused thereby may increase. In certain forms, the current spreading layer 130 has a thickness ranging from 10 nm to 30 nm, such as 15 nm or 20 nm.

The first openings 161 and the first through holes 162 are cooperatively arranged in an array. Each of the first openings 161 has a diameter identical to that of each of the first through holes 162. A ratio of the number of the first openings 161 to the number of the first through holes 162 ranges from 2:1 to 20:1 (such as 2:1, 3:1 or 5:1). Each of the first through holes 162 may be surrounded by the first openings 161 of the current spreading layer 130. The first openings 161 immediately adjacent to the first through hole 162 are arranged in a polygon pattern (D1) (see FIG. 12).

Figure 13:
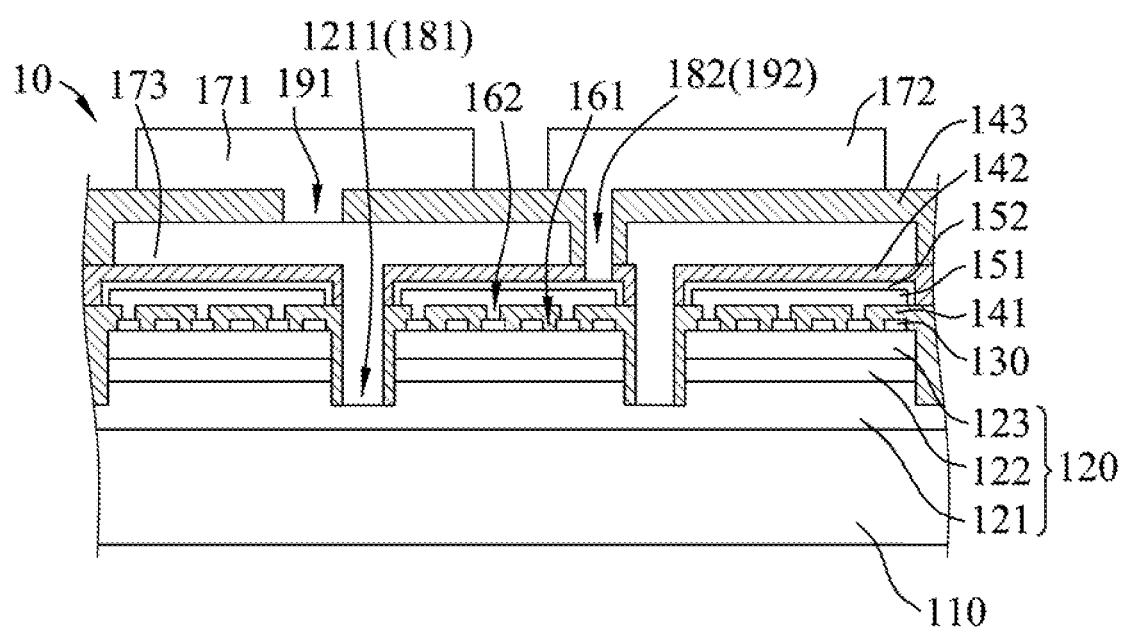
FIG. 13 is a fragmentary schematic view illustrating a third embodiment of the LED device according to the disclosure.

Referring to FIG. 13, a third embodiment of the LED device 10 is generally similar to the second embodiment, except that in the third embodiment, the epitaxial layered structure 120 is formed with a plurality of the recesses 1211. Each of the first openings 161 has a diameter ranging from 2 μm to 50 μm, such as 2 μm to 20 μm (e.g., 2 μm, 5 μm or 10 μm). In this embodiment, the LED device 10 has a relative larger size, e.g., with a length greater than 300 μm. In addition, the first and second electrodes 171, 172 and the first and second penetrating holes 181, 182 are formed at positions different from those in the second embodiment. Specifically, the LED device 10 further includes a conductive metal layer 173 which is disposed on the second Insulating layer 142 and electrically connected to the first-type semiconductor layer 121 through the recesses 1211, and a third insulating layer 143 which is formed on the conductive metal layer 173. The first penetrating hole 181 exposes a portion of the conductive metal layer 173. The second penetrating hole 182 extends through the third insulating layer 143, the conductive metal layer 173 and the second insulating layer 142 to expose a portion of the metallic barrier layer 152 of the reflective structure 150. The third insulating layer 143 also covers sidewalls of the conductive metal layer 173 exposed by the second penetrating hole 182. The first and second electrodes 171, 172 are formed on the third insulating layer 143. The first electrode 171 is electrically contacted to the conductive metal layer 173 through the first penetrating hole 181. The second electrode 172 is electrically contacted to the reflective structure 150 through the second penetrating hole 132.

The method for manufacturing the third embodiment of the LED device 10 is described below.

Figure 14:
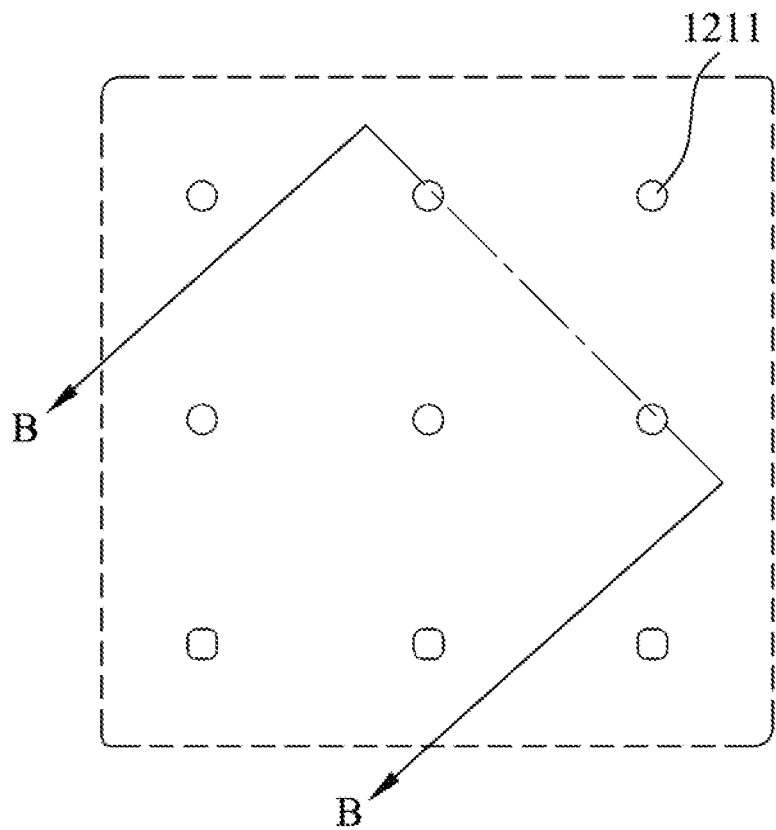
Figure 15:
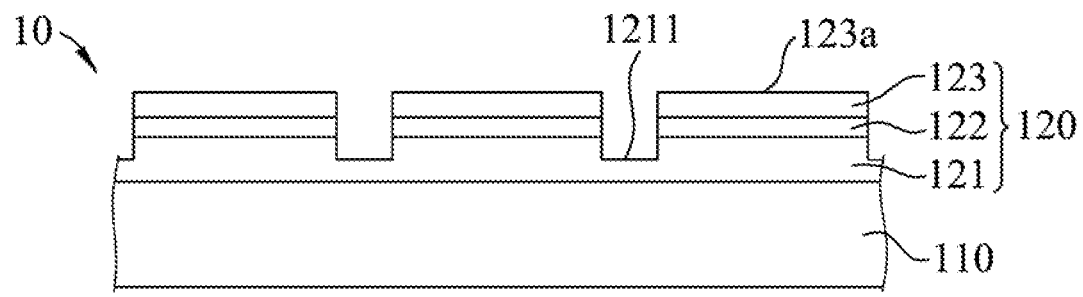

Referring to FIGS. 14 and 15, the epitaxial layered structure 120 is formed on the substrate 100 by e.g., a MOCVD process, and then subjected to an etching process so as to obtain a plurality of the recesses 1211.

Specifically, the epitaxial layered structure 120 includes the first-type semiconductor layer 121, the active layer 122 and the second-type semiconductor layer 123 sequentially disposed on the substrate 110 in such order. In this embodiment, the first-type semiconductor layer 121 is an n-GaN layer, the second-type semiconductor layer 123 is a p-GaN layer, and the active layer 122 is a GaN-based layer having a multiple quantum well structure, but are not limited thereto. The epitaxial layered structure 120 may further include a buffer layer disposed between the substrate 110 and the first-type semiconductor layer 21, and an electron blocking layer (EBL) disposed between the active layer 122 and the second-type semiconductor layer 123 (not shown in the figures).

Each of the recesses 1211 is defined by a recess-defining wall, extends through the second-type semiconductor layer 123 and the active layer 122, and terminates at the first-type semiconductor layer 121 to expose a portion of the first-type semiconductor layer 121. The etching process may be, for example, an ICP process or a RIE process.

Figure 16:
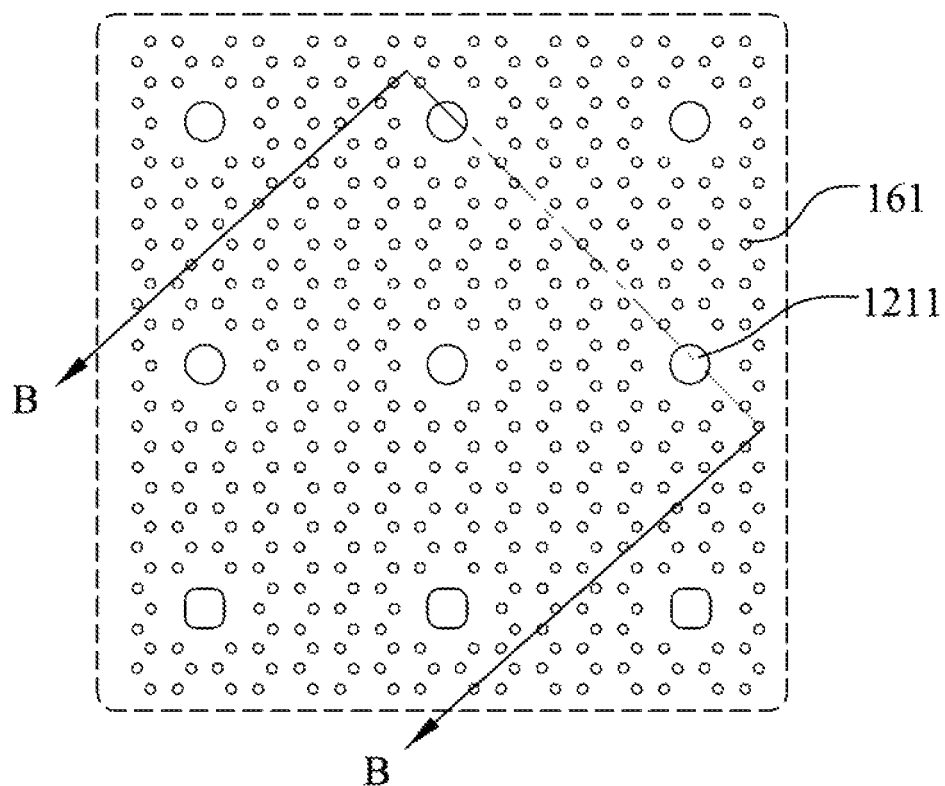
Figure 17:
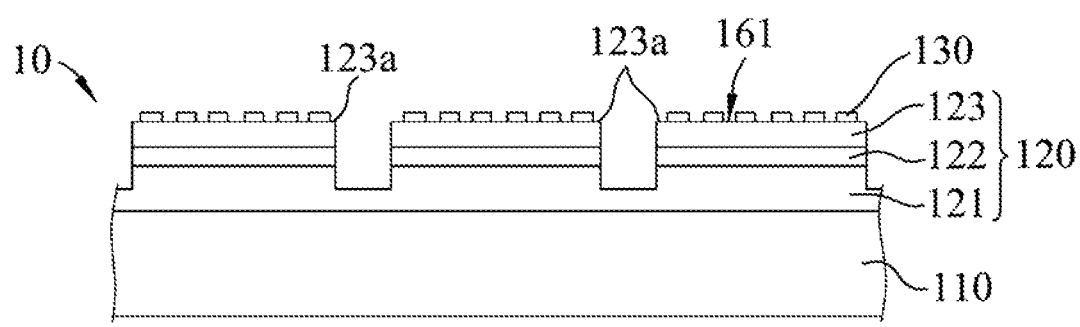

Referring to FIGS. 16 and 17, the current spreading layer 130 is formed on the surface 123a of the second-type semiconductor layer 123 opposite to the active layer 122, and then is patterned by, for example, a photolithography process to form a plurality of the first openings 161 each exposing a portion of the surface 123a of the second-type semiconductor layer 123. The patterned current spreading layer 130 may have a total area accounting for more than 50% and less than 95% of an area of a projection of the epitaxial layered structure 120 on the substrate 110. Each of the first openings 161 has a diameter ranging from 2 μm to 50 μm, and the first openings 161 are spaced apart from one another by a spacing ranging from 1 μm to 20 μm. In this embodiment, the first openings 161 are arranged in an array as shown in FIG. 16, the diameter of each of the first openings 161 ranges from 2 μm to 20 μm, and the spacing of two adjacent ones of the first openings 161 ranges from 5 μm to 20 μm.

Figure 18:
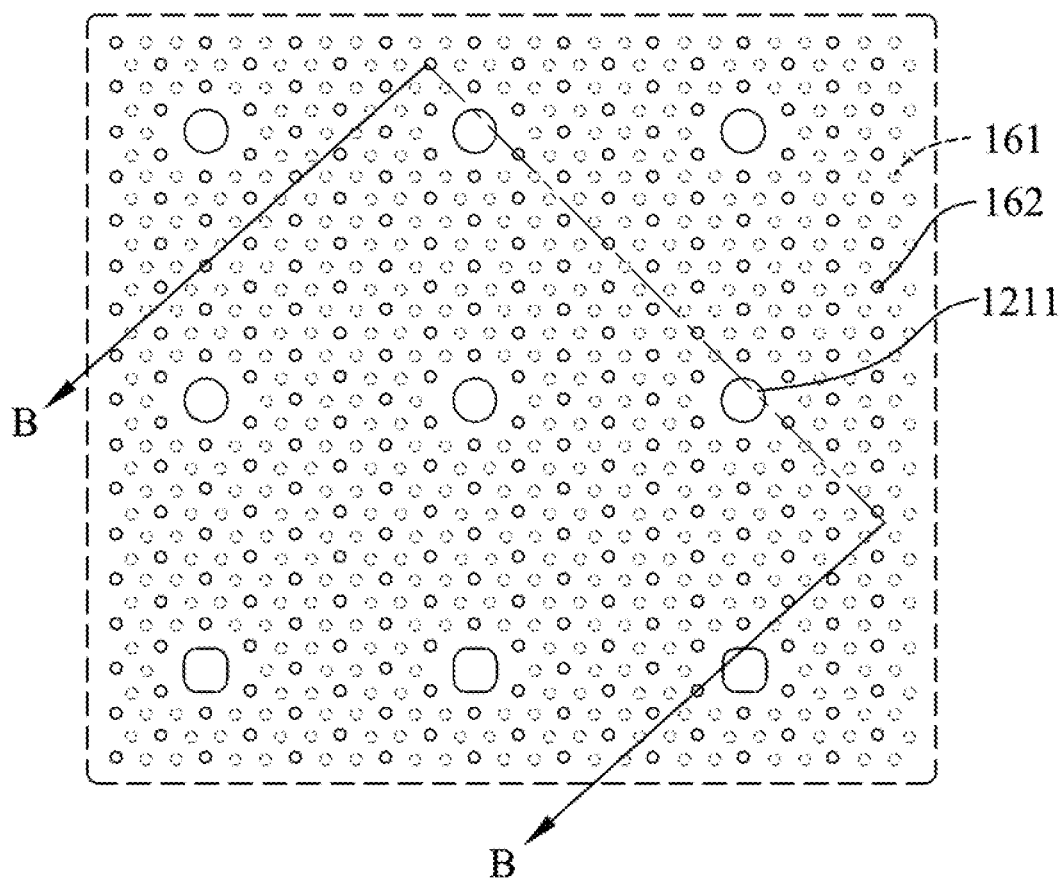
Figure 19:
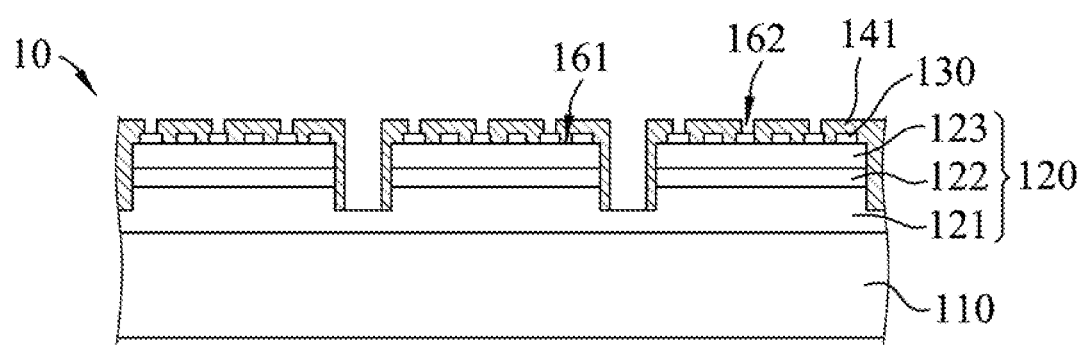

Referring to FIGS. 18 and 19, the first insulating layer 141 is formed on the current spreading layer 130, is filled into the first openings 161, and covers the recess-defining wall of each of the recesses 1211. Then, the first insulating layer 141 is etched to form the first through holes 162. The first through holes 162 are arranged in an array, each of which may have a diameter ranging from 1 μm to 50 μm (such as 1 μm to 20 μm). The first through holes 162 may have a total cross-sectional area accounting for 3% to 50% (such as 5% to 20% or 10%) of an area of a projection of the epitaxial layered structure 120 on the substrate 110.

Figure 20:
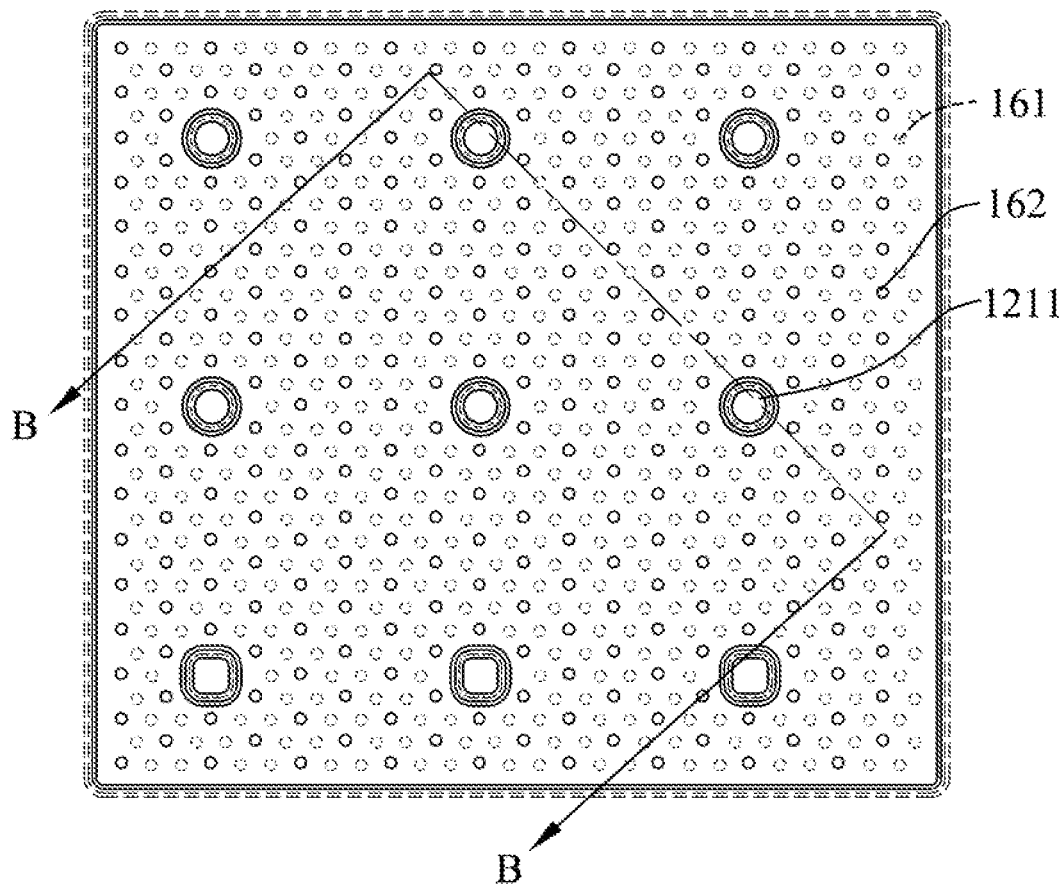
Figure 21:
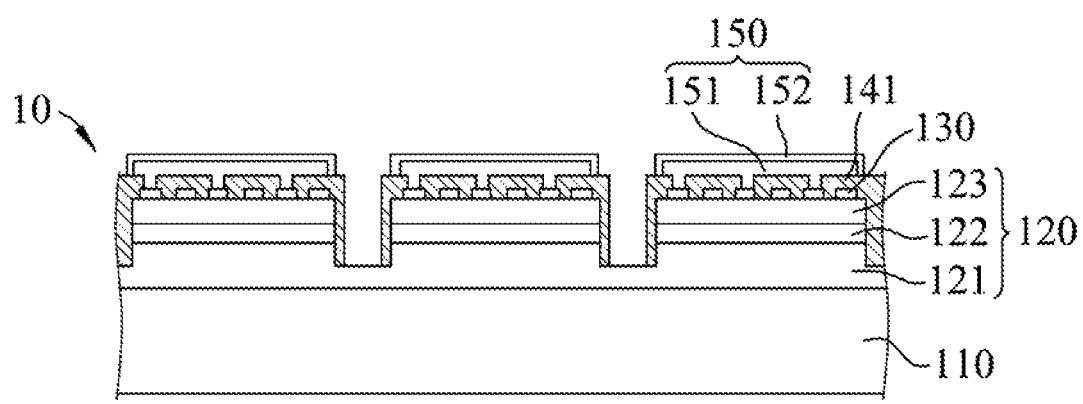

Referring to FIGS. 20 and 21, the metallic reflecting layer 151 is formed on the first insulating layer 141 and contacts with the current spreading layer 130 through the first through holes 162. Then, the metallic barrier layer 152 is further disposed over the metallic reflecting layer 151. The metallic reflecting layer 151 may be made of a metal having high reflectance, such as aluminum (Al) or silver (Ag) for serving as a mirror, and the metallic barrier layer 152 may be made of titanium tungsten (TiW), chromium (Cr), platinum (Pt) or titanium (Ti) for protecting the metallic reflecting layer 151. The metallic reflecting layer 151 and the metallic barrier layer 152 cooperate to form the reflective structure 150.

Figure 22:
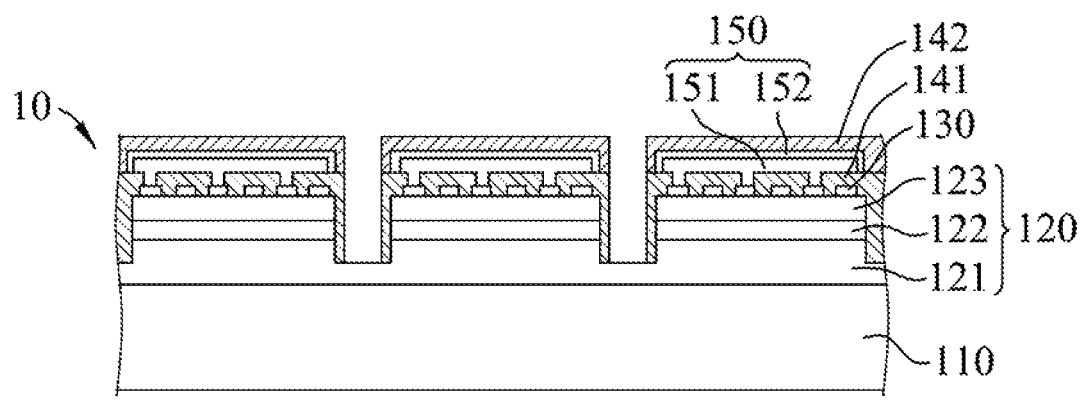
Figure 23:
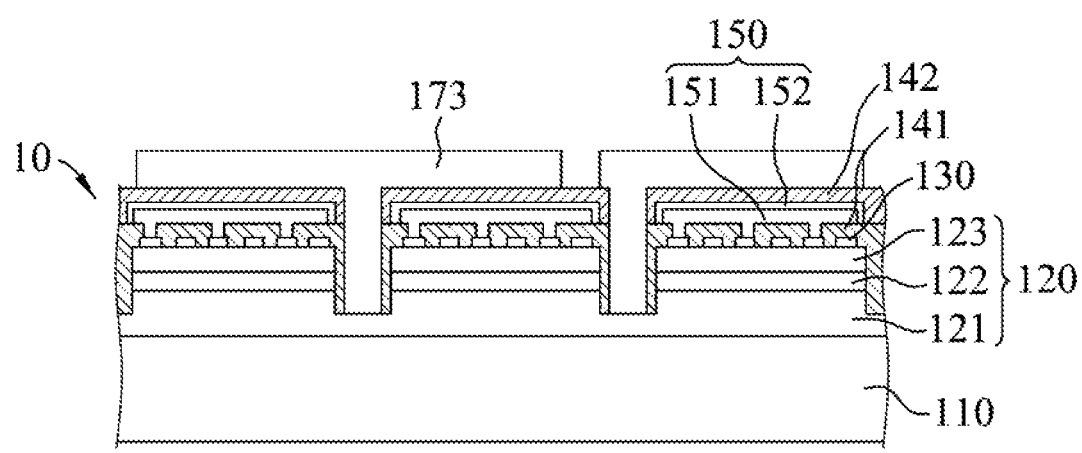

Referring to FIGS. 22 and 23, the second insulating layer 142 is disposed over the metallic barrier layer 152, and then the conductive metal layer 173 is formed on the second insulating layer 142, and contacts with the exposed first-type semiconductor layer 121 through the recesses 1211. Next, the conductive metal layer 173 is subjected to an etching process to form a through hole to expose a portion of the second insulating layer 142.

Referring back to FIG. 13, the third insulating layer 143 is formed over the conductive metal layer 173 and contacts with the exposed portion of the second insulating layer 142 through the through hole. Thereafter, an etching process is performed to form the first penetrating hole 181 which exposes a portion of the conductive metal layer 173, and the second penetrating hole 182 which extends through the third insulating layer 143, the conductive metal layer 173 and the second insulating layer 142 so as to expose a portion of the metallic barrier layer 152. Finally, the first and second electrodes 171, 172 are formed on the third insulating layer 143 so that the first electrode 171 contacts with the conductive metal layer 173 through the first penetrating hole 181, and the second electrode 172 contacts with the reflective structure 150 through the second penetrating hole 182.

Figure 24:
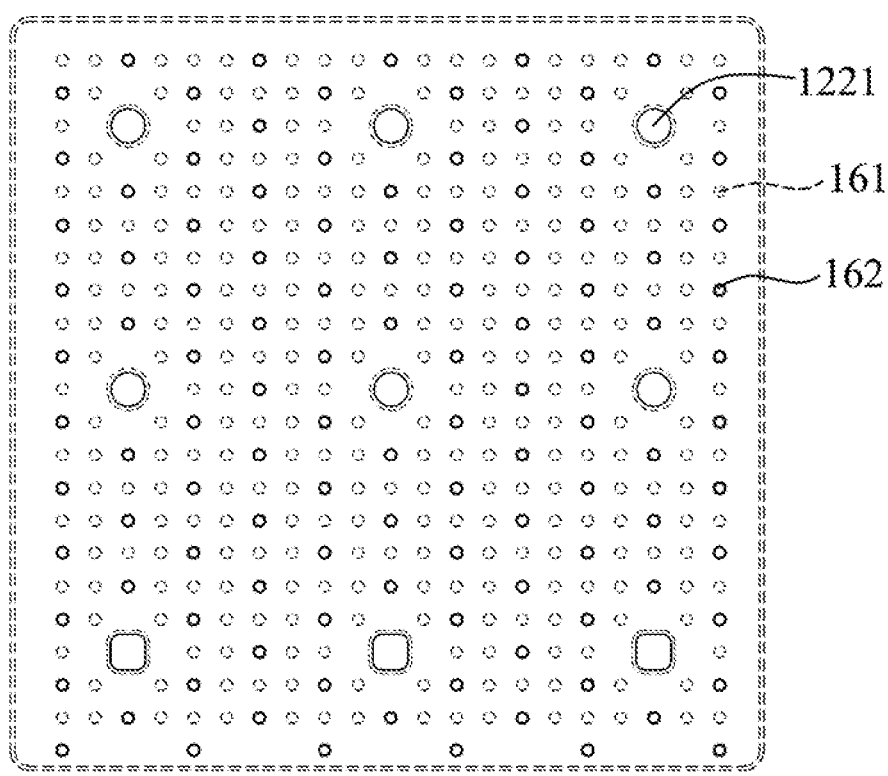
FIG. 24 is a top view illustrating the third embodiment.
Figure 25:
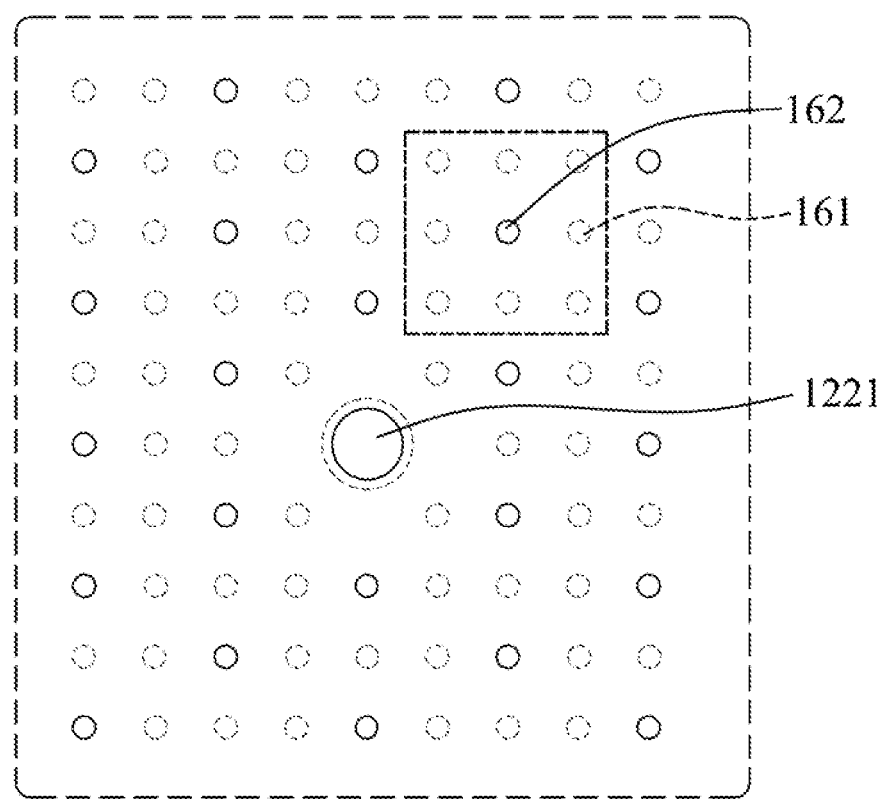
FIG. 25 is an enlarged view of FIG. 24.

Referring to FIGS. 24 and 25, a fourth embodiment of the LED device 10 is generally similar to the third embodiment, except that in the fourth embodiment, the arrangement of the first openings 161 and the first through holes 162 is different from that of the third embodiment. In this embodiment, one of the first through holes 162 and eight of the first openings 161 immediately adjacent to the first through hole 162 cooperatively form a square pattern or a rectangular pattern, and the first through hole 162 is positioned at a geometric center of the pattern. In this embodiment, a ratio of the number of the first openings 161 to the number of the first through holes 162 is approximately 3:1.

Figure 26:
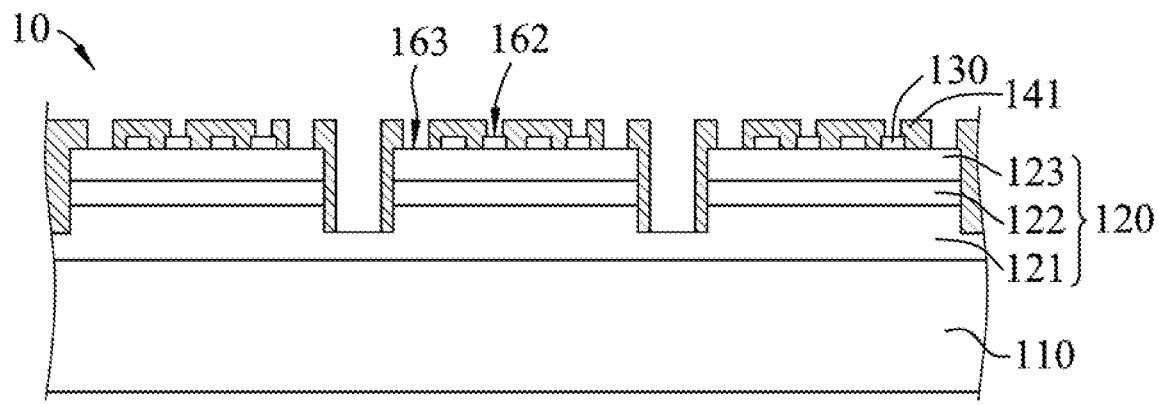
FIGS. 26 and 27 are fragmentary schematic views illustrating consecutive steps for forming a metallic reflecting layer and a metallic barrier layer on a fourth embodiment of the LED device according to the disclosure.
Figure 27:
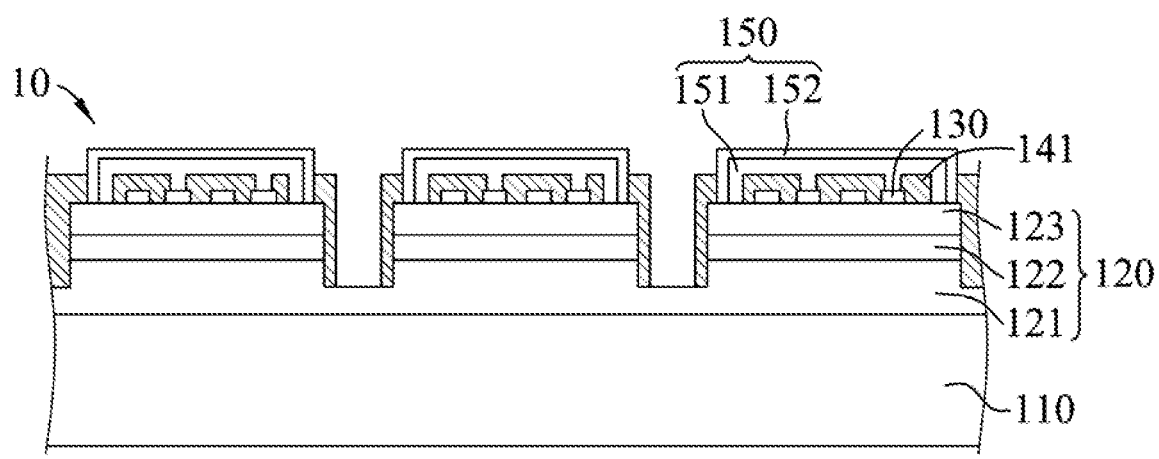

Referring to FIGS. 26 and 27, a fifth embodiment of the LED device 10 is generally similar to the third embodiment, except that in the fifth embodiment, the first insulating layer 141 is further formed with a plurality of the second through holes 163, each of which exposes a portion of the second-type semiconductor layer 123. The second through holes 163 are spaced apart from the first through holes 162 and the first openings 161. The shape, size and number of the second through holes 163 may be referred to those described in the first embodiment, and thus the details thereof are omitted herein for the sake of brevity. The metallic reflective layer 151 and the metallic barrier layer 152 of the reflective structure 150 further extend into the second through holes 163 and contact with the second-type semiconductor layer 123 of the epitaxial layered structure 120. The sidewall of the first insulating layer 141 also contacts with the metallic reflective layer 151, so that the adherence between the metallic reflective layer 151 and the first insulating layer 141 can be increased, thereby increasing the reliability of the LED device 10.

Figure 28:
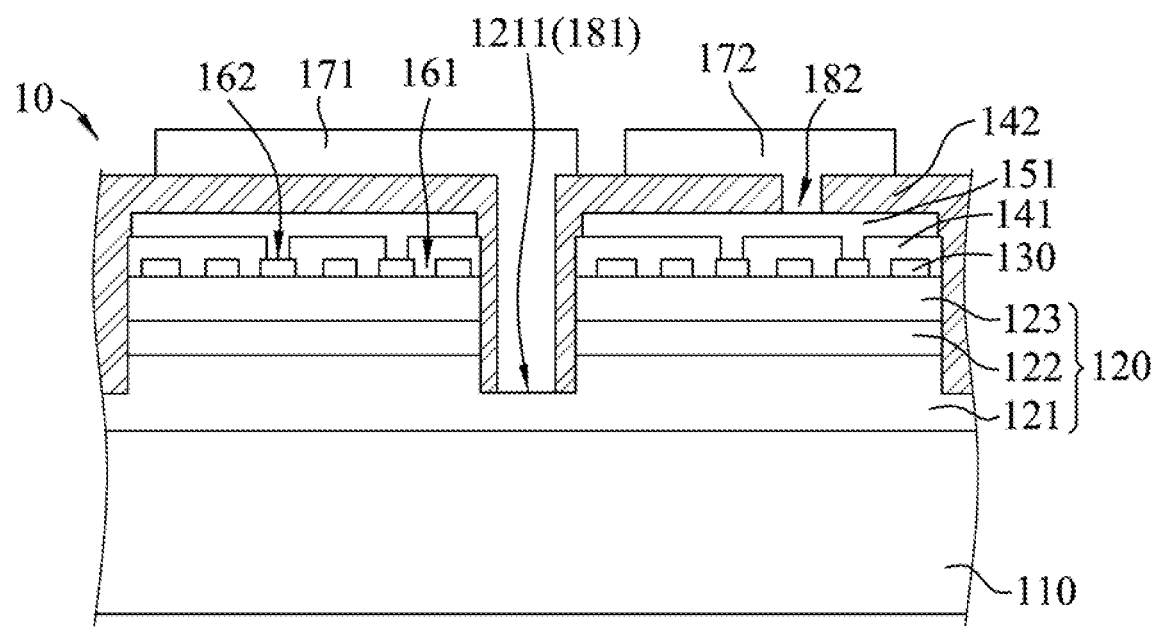
FIG. 28 is a fragmentary schematic view showing a fifth embodiment of the LED device according to the disclosure.

Referring to FIG. 28, a sixth embodiment of the LED device 10 is generally similar to the second embodiment, except that in the sixth embodiment, the reflective structure 150 only includes the metallic reflective layer 151. The current spreading layer 130, the first insulating layer 141 and the metallic reflective layer 151 cooperate to form an ODR structure, so as to improve the light extraction efficiency and the brightness of the LED device 10. In addition, the second insulating layer 142 covers the recess-defining wall and is made of an insulating reflective material, such as $TiO_2$, $SiO_2$, $HfO_2$, $ZrO_2$, $Nb_2O_5$ and $MgF_2$. When a light emitted from the active layer 122 passes through the current spreading layer 130 and reaches the ODR structure and the second insulating layer 142, most of the light may be reflected back to the epitaxial layered structure 120 by the second insulating layer 142, passes through the substrate 110 and is then exited therefrom, so that the optical loss caused by the light exiting from the surface and sidewall of the epitaxial layered structure 120 may be reduced. In certain forms, the second insulating layer 142 is capable of reflecting at least 80% or 90% of the light emitting from the active layer 122. The second insulating layer 142 may include a DBR, which may be formed by alternately stacking at least two insulating dielectric layers having different refractive indices. For example, the DBR may include 4 pairs to 20 pairs of layers, each pair including a $TiO_2$ layer and a $SiO_2$ layer, and the $TiO_2$ layers and the $SiO_2$ layers in the DBR are alternately stacked. In addition, the DBR may further include an interface layer on which the pairs of layers are disposed, so as to improve film quality of the PBR. The interface layer may be made of $SiO_2$ and may have a thickness ranging from 0.2 μm to 1.0 μm. Moreover, the second insulating layer 142 covering the metallic reflecting layer 151 and sidewalls of the epitaxial layered structure 120 (i.e., the recess-defining walls) can prevent water vapor from entering into the epitaxial layered structure 120, thereby reducing the risk of electrical leakage.

Figure 29:
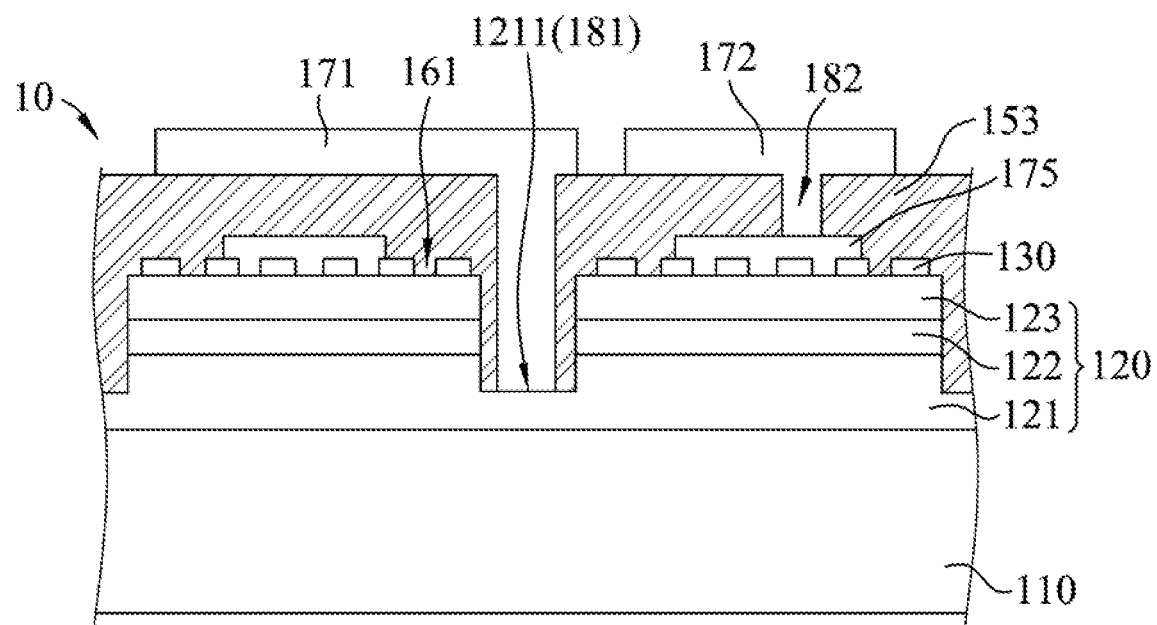
FIG. 29 is a fragmentary schematic view shewing a sixth embodiment of the LED device according to the disclosure.
Figure 30:
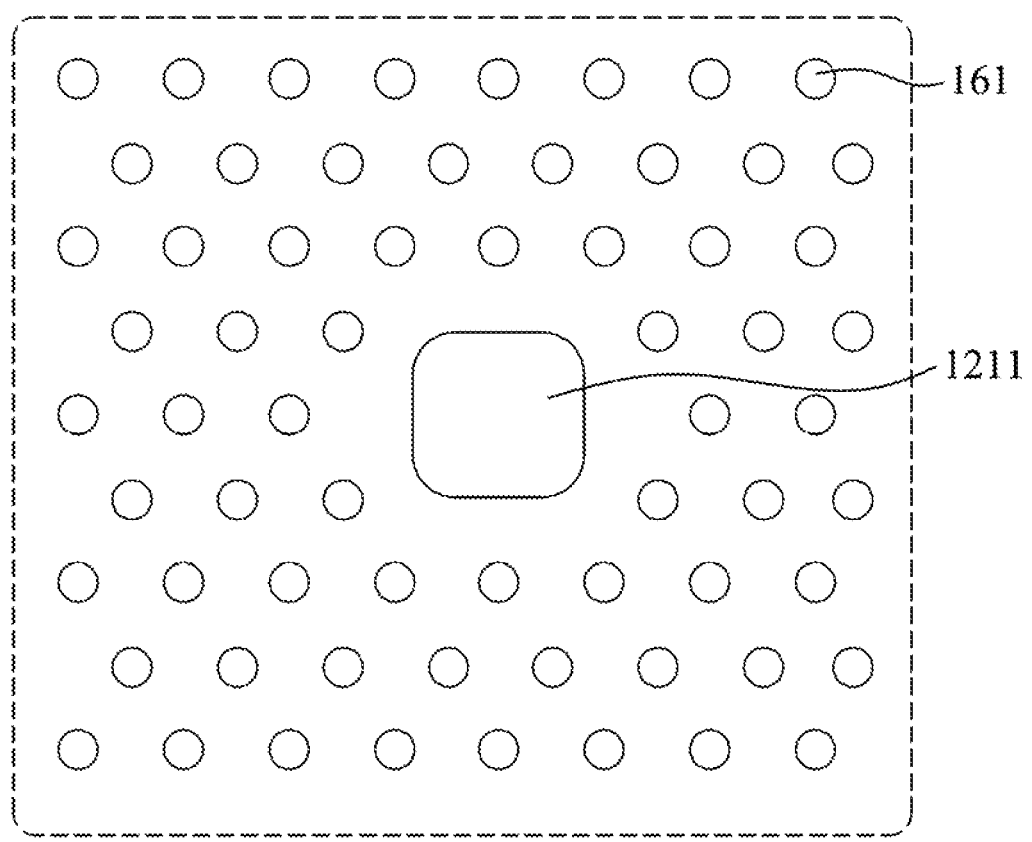
FIG. 30 is a top view of the sixth embodiment.

Referring to FIG. 29, a seventh embodiment of the LED device 10 according to the disclosure is generally similar to the second embodiment, except for the following differences. Specifically, the first openings 161 of the current spreading layer 130 have a total cross-sectional area accounting for 10% to 40% of an area of a projection of the epitaxial layered structure 120 on the substrate 110. Each of the first openings 161 of the current spreading layer 130 has a diameter ranging from 0.1 μm to 50 μm. The LED device 10 may have a micro size. For example, the LED device 10 may have a cross sectional area smaller than 62500 μm² and each of the first openings 161 has a diameter ranging from 2 μm to 10 μm. Alternatively, the LED device 10 may have a medium or large size. For example, the LED device 10 may have a cross sectional area larger than 90000 μm² and each of the first openings 161 has a diameter equal to or larger than 2 μm (such as 2 μm to 5 μm, 5 μm to 10 μm, 10 μm to 20 μm, or more than 20 μm). In certain forms, each of the first openings 161 has a diameter ranging from 2 μm to 20 μm in order to better control the forward voltage ($V_F$) and the light output power (LOP), i.e., brightness. The first openings 161 of the current spreading layer 130 are spaced apart from one another by a spacing ranging from 1 μm to 20 μm. In this embodiment, each of the first openings 161 has a diameter ranging from 2 μm to 10 μm and the first openings 161 are spaced apart from one another by a spacing ranging from 5 μm to 20 μm.

In addition, the LED device 10 further includes an extended electrode 175 that is disposed on the current spreading layer 130 and that is electrically contacted with the second-type semiconductor layer 123 through a portion of the first openings 161 of the current, spreading layer 130. Since a contact resistance between the extended electrode 175 and the second-type semiconductor layer 123 is larger than a contact resistance between the extended electrode 175 and the current spreading layer 130, the current passing through the extended electrode 175 can be ensured to flow through the current spreading layer 130 for current spreading and then flow into the second-type semiconductor layer 123. In this way, the forward voltage ($V_F$) can be lowered and the light emitting efficiency can be increased.

The first insulating layer 141 and the reflective structure 150 are integrally formed as a reflective insulating member 153 which is disposed over the extended electrode 175 and the current spreading layer 130. In addition, the reflective insulating member 153 is formed with the first penetrating hole 181 to expose the first-type semiconductor layer 121, and is formed with the second penetrating hole 182 to expose the extended electrode 175. The first and second electrodes 171, 172 are formed on the reflective insulating member 153. The first electrode 171 electrically contacts with the first-type semiconductor layer 121 through the first penetrating hole 181. The second electrode 172 electrically contacts with the extended electrode 175 through the second penetrating hole 182, and electrically connects to the second-type semiconductor layer 123 through the current spreading layer 130.

In conclusion, by forming the current spreading layer 130, the first insulating layer 141 and the reflective structure 150 as an ODR structure, which has better reflectance than a conventional metallic reflecting layer or DBR, the LED device 10 of this disclosure can exhibit improved external light extraction efficiency and brightness. In addition, by contacting the reflective structure 150 with the current spreading layer 130 through the first through hole(s) 162 formed on the first insulating layer 141, the forward voltage ($V_F$) of the LED device 10 can be maintained (i.e., without increasing the forward voltage). By forming the first openings 161 on the current spreading layer 130, the ohmic contact between the current spreading layer 130 and the epitaxial layered structure 120 can be further improved, and the optical absorption of the current spreading layer 130 can be reduced so as to increase the brightness of the LED device 10 of this disclosure.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also foe appreciated that reference throughout, this specification to "one embodiment," "an embodiment," an embodiment with an indication of an ordinal number and so forth means that, a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting diode (LED) device, comprising:
an epitaxial layered structure including a first-type semiconductor layer, an active layer and a second-type semiconductor layer sequentially disposed in such order;
a current spreading layer formed on a surface of said second-type semiconductor layer opposite to said active layer;
a first insulating layer formed over said current spreading layer and formed with at least one first through hole to expose a portion of said current spreading layer; and
a reflective structure formed on said first insulating layer, extending into said at least one first through hole, and contacting with said current spreading layer,
wherein said current spreading layer is formed with at least one opening structure to expose a portion of said surface of said second-type semiconductor layer opposite to said active layer, and said opening structure is arranged in a staggered arrangement with said first through hole,
wherein said first insulating layer is further formed on said surface of said second-type semiconductor layer, and is further formed with at least one second through hole to expose a portion of said surface of said second-type semiconductor layer, said reflective structure extending into said second through hole, and contacting with said surface of said second-type semiconductor layer,
wherein said epitaxial layered structure is formed with at least one recess that extends through said second-type semiconductor layer and said active layer, and that terminates at said first-type semiconductor layer to expose said first-type semiconductor layer, and
wherein said second through hole corresponds in position to and surrounds said at least one recess.

2. The LED device of claim 1, wherein said first insulating layer is formed with a plurality of said first through holes that are arranged in an array.

3. The LED device of claim 2, wherein said first insulating layer is further formed with a plurality of second through holes, each of which is formed in one of a continuous loop shape, a discontinuous loop shape and a strip shape.

4. The LED device of claim 3, wherein a ratio of the number of said first through holes to the number of said second through holes ranges from 5:1 to 50:1.

5. The LED device of claim 2, wherein said first through holes have a total cross-sectional area accounting for 3% to 50% of an area of a projection of said epitaxial layered structure on said substrate.

6. The LED device of claim 1, wherein said opening structure includes at least one first opening to expose a portion of said surface of said second-type semiconductor layer, said first insulating layer extending into said first opening and contacting with said second-type semiconductor layer.

7. The LED device of claim 6, wherein said first insulating layer is formed with a plurality of said first through holes that are spaced apart from each other, and said current spreading layer is formed with a plurality of said first openings.

8. The LED device of claim 7, wherein said first insulating layer is formed with a plurality of said second through holes to expose the portion of said second-type semiconductor layer, said second through holes being spaced apart from said first through holes and said first openings.

9. The LED device of claim 7, wherein each of said first through holes is surrounded by said first openings of said current spreading layer, said first openings immediately adjacent to said first through hole being arranged in a polygon pattern.

10. The LED device of claim 7, wherein each of said first openings of said current spreading layer has a diameter ranging from 2 μm to 50 μm.

11. The LED device of claim 7, wherein said first openings of said current spreading layer are spaced apart from each other by a spacing ranging from 1 μm to 20 μm.

12. The LED device of claim 7, wherein said first openings have a total cross-sectional area accounting for 5% to 50% of an area of a projection of said epitaxial layered structure on said substrate.

13. The LED device of claim 7, wherein said first openings of said current spreading layer are arranged in an array.

14. The LED device of claim 7, wherein a ratio of the number of said first openings to the number of said first through holes ranges from 2:1 to 20:1.

15. The LED device of claim 7, wherein said first openings and said first through holes are cooperatively arranged in an array.

16. The LED device of claim 7, wherein said first through holes of said first insulating layer have a total cross-sectional area accounting for 3% to 50% of an area of a projection of said epitaxial layered structure on said substrate.

17. The LED device of claim 8, wherein a ratio of the number of said first through holes and the number of said second through holes ranges from 5:1 to 50:1.

18. The LED device of claim 8, wherein said first openings of said current spreading layer and said first through holes of said first insulating layer are arranged in an array, and each of said second through holes is formed in one of a continuous loop shape, a discontinuous shape and a strip shape.

19. The LED device of claim 1, wherein said first insulating layer is made of a material selected from the group consisting of silicon nitride, silicon oxide, aluminum oxide, magnesium fluoride, titanium dioxide, and combinations thereof.

20. The LED device of claim 1, wherein said current spreading layer has a thickness ranging from 5 nm to 60 nm.

21. The LED device of claim 1, wherein said active layer is configured to emit light having an emission wavelength not greater than 520 nm.

22. The LED device of claim 1, wherein said second through hole is formed in one of a continuous loop shape and a discontinuous loop shape and has a diameter larger than that of said at least one recess.

23. The LED device of claim 22, wherein said recess is defined by a recess-defining wall, said first insulating layer covering said recess-defining wall and exposing said first-type semiconductor layer.

24. The LED device of claim 23, further comprising a first electrode which is electrically connected to said first-type semiconductor layer through said recess, and a second electrode which is disposed on said reflective structure and which is electrically connected to said second-type semiconductor layer.

25. The LED device of claim 24, further comprising a second insulating layer that is disposed over said reflective structure, that is formed with a first penetrating hole which is spatially communicated with said recess to expose said first-type semiconductor layer, and that is formed with a second penetrating hole to expose said reflective structure, said second electrode being disposed on said second insulating layer and filling said second penetrating hole to contact with said reflective structure, said first electrode being disposed on said second insulating layer and being electrically connected to said first-type semiconductor layer through said recess and said first penetrating hole.

26. The LED device of claim 25, wherein said second insulating layer further covers said recess-defining wall, and is made of an insulating reflective material.

27. The LED device of claim 1, wherein said first insulating layer includes a distributed Bragg reflector.

28. The LED device of claim 1, wherein said reflective structure includes a metallic reflecting layer and a metallic barrier layer sequentially formed on said first insulating layer in such order.

29. The LED device of claim 1, wherein said first insulating layer has a thickness larger than a thickness of said current spreading layer.

30. A light emitting diode (LED) device, comprising:
an epitaxial layered structure including a first-type semiconductor layer, an active layer and a second-type semiconductor layer sequentially disposed in such order;
a current spreading layer formed on a surface of said second-type semiconductor layer opposite to said active layer;
a first insulating layer formed over said current spreading layer and formed with at least one first through hole to expose a portion of said current spreading layer; and
a reflective structure formed on said first insulating layer, extending into said at least one first through hole, and contacting with said current spreading layer,
wherein said current spreading layer is formed with at least one opening structure to expose a portion of said surface of said second-type semiconductor layer opposite to said active layer, and said opening structure is arranged in a staggered arrangement with said first through hole,
wherein said first insulating layer is further formed on said surface of said second-type semiconductor layer, and is further formed with at least one second through hole to expose a portion of said surface of said second-type semiconductor layer, said reflective structure extending into said second through hole, and contacting with said surface of said second-type semiconductor layer,
wherein said epitaxial layered structure is formed with at least one recess that extends through said second-type semiconductor layer and said active layer, and that terminates at said first-type semiconductor layer to expose said first-type semiconductor layer, and
wherein said second through hole corresponds in position to and surrounds said at least one recess and has a diameter larger than that of said at least one recess.

* * * * *